United States Patent
Iwasaki et al.

(10) Patent No.: US 9,648,259 B2
(45) Date of Patent: *May 9, 2017

(54) IMAGING APPARATUS AND CAMERA SYSTEM FOR IMPROVING IMAGE QUALITY

(71) Applicant: Sony Corporation, Tokyo (JP)

(72) Inventors: Masanori Iwasaki, Kanagawa (JP); Ken Ozawa, Kanagawa (JP); Nobuyuki Matsuzawa, Tokyo (JP); Daisuke Hobara, Kanagawa (JP); Nozomi Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/386,264

(22) Filed: Dec. 21, 2016

(65) Prior Publication Data
US 2017/0104941 A1 Apr. 13, 2017

Related U.S. Application Data

(63) Continuation of application No. 15/233,273, filed on Aug. 10, 2016, which is a continuation of application
(Continued)

(30) Foreign Application Priority Data

Jul. 9, 2013 (JP) .................................. 2013-143566

(51) Int. Cl.
*H04N 5/225* (2006.01)
*H04N 5/217* (2011.01)
(Continued)

(52) U.S. Cl.
CPC ....... *H04N 5/3572* (2013.01); *H01L 27/1462* (2013.01); *H01L 27/14625* (2013.01);
(Continued)

(58) Field of Classification Search
CPC .... H04N 5/369; H04N 5/3572; H04N 5/2253; H04N 5/2254; H01L 27/14618;
(Continued)

(56) References Cited

U.S. PATENT DOCUMENTS 7,616,250 B2* 11/2009 Watanabe ......... H01L 27/14618
257/432
8,279,336 B2* 10/2012 Tsuduki ............ H01L 27/14618
348/374
(Continued)

FOREIGN PATENT DOCUMENTS

JP 2006-222249 8/2006
JP 2012-186434 9/2012

*Primary Examiner* — Nicholas Giles
(74) *Attorney, Agent, or Firm* — Sheridan Ross P.C.

(57) ABSTRACT

An imaging apparatus that forms an image of a light beam transmitted through an imaging lens on an imaging element includes a laminated material that is provided on the imaging element, the light beam being transmitted through the laminated material, the laminated material being provided at a position at which an end portion of an upper surface of the laminated material allows an outermost light beam out of light beams to be transmitted therethrough, the light beams entering a pixel in an outer end portion of the imaging element in an effective pixel area, the position having a width Hopt.

16 Claims, 10 Drawing Sheets

Related U.S. Application Data

No. 15/045,019, filed on Feb. 16, 2016, now Pat. No. 9,432,598, which is a continuation of application No. 14/315,967, filed on Jun. 26, 2014, now Pat. No. 9,294,697.

(51) Int. Cl.
*H01L 27/146* (2006.01)
*H04N 5/357* (2011.01)

(52) U.S. Cl.
CPC .. *H01L 27/14636* (2013.01); *H01L 27/14643* (2013.01); *H04N 5/2173* (2013.01); *H04N 5/2253* (2013.01); *H04N 5/2254* (2013.01)

(58) Field of Classification Search
CPC ..... H01L 27/14623; H01L 2224/45144; H01L 2224/48463; H01L 2924/00
See application file for complete search history.

(56) References Cited

U.S. PATENT DOCUMENTS

| | | | | |
|---|---|---|---|---|
| 8,300,143 | B2* | 10/2012 | Bonkohara | H01L 27/14618 348/373 |
| 9,294,697 | B2* | 3/2016 | Iwasaki | H01L 27/14618 |
| 9,432,598 | B2* | 8/2016 | Iwasaki | H01L 27/14618 |
| 2006/0023108 | A1* | 2/2006 | Watanabe | H01L 27/14618 348/335 |
| 2011/0122303 | A1* | 5/2011 | Bonkohara | H01L 27/14618 348/294 |
| 2015/0015751 | A1* | 1/2015 | Iwasaki | H01L 27/14618 348/294 |
| 2016/0165158 | A1* | 6/2016 | Iwasaki | H01L 27/14618 348/340 |
| 2016/0353037 | A1* | 12/2016 | Iwasaki | H01L 27/14618 |

\* cited by examiner

IMAGING APPARATUS AND CAMERA SYSTEM FOR IMPROVING IMAGE QUALITY

CROSS REFERENCE TO RELATED APPLICATIONS

The present application is a Continuation of application Ser. No. 15/233,273, filed Aug. 10, 2016, which is a Continuation of application Ser. No. 15/045,019, filed Feb. 16, 2016, now U.S. Pat. No. 9,432,598, issued Aug. 30, 2016, which is a Continuation of application Ser. No. 14/315,967, filed Jun. 26, 2014, now U.S. Pat. No. 9,294,697, issued Mar. 22, 2016, which claims the benefit of Japanese Priority Patent Application JP 2013-143566, filed Jul. 9, 2013, the entire contents of which are each incorporated herein by reference.

BACKGROUND

The present disclosure relates to an imaging apparatus and a camera system, and more particularly to an imaging apparatus and a camera system that are capable of sufficiently exerting the function of an optical filter while reducing noise light such as flare and ghost.

An advanced process is introduced into an image sensor in a solid-state imaging apparatus as in other semiconductor chips. Thus, the size of chips has been decreasing in recent years. In response to this, when a solid-state imaging apparatus in which an image sensor and a substrate are connected by wire bonding is designed, for example, it is conceivable to design that a bonding pad is arranged in the effective diameter of a lens in the image sensor.

In such a case, however, light that has entered from the lens is reflected on the surface of a wire (gold wire) connected to the bonding pad and enters a light-receiving surface of the image sensor. As a result, flare or ghost may be caused.

In view of this, proposed is a solid-state imaging apparatus in which a light blocking member that blocks a light beam of light from the lens, which has entered in the vicinity of the bonding pad arranged on the image sensor, is provided (see Japanese Patent Application Laid-open No. 2006-222249).

Accordingly, it is possible to reduce flare and ghost caused due to the light that has entered from the lens and is reflected on the surface of the gold wire that is connected to the bonding pad to enter the light-receiving surface of the image sensor.

However, incident light may be reflected also on the edge portion of an opening in the light blocking member. As a result, flare or ghost may be caused.

In view of the above, proposed is a technique in which flare or ghost caused due to the reflected light on the edge portion of the opening in the light blocking member is reduced by making the angle of the edge surface of the opening with respect to an optical axis direction of the incident light larger than the incidence angle of the light that has entered the edge portion of the light blocking member (see Japanese Patent Application Laid-open No. 2012-186434).

SUMMARY

Now, with reference to the top portion of FIG. 1, the cross-sectional configuration of an existing solid-state imaging apparatus will be described. An object exists in a direction of the upper side of FIG. 1. Incident light from the direction in which the object exists passes through an ICRF (Infrared Ray Cut Filter) 11, and is received by an imaging device 22 via a laminated material (optical filter) 21. The imaging device 22 is provided on a substrate 23 and includes a CMOS (Complementary Metal Oxide Semiconductor), for example. The imaging device 22 photoelectrically converts incident light into a pixel signal and outputs the pixel signal from a wiring 26 to a signal processing unit (not shown) via a pad portion 25 connected to a wiring layer 24 formed on the imaging device 22.

Moreover, to the ICRF 11, a light blocking portion 12 is provided. Incident light is reflected on the wiring 26, and thus noise light such as flare or ghost caused due to light received by the imaging device 22 is reduced. Moreover, as shown in the top portion of FIG. 1, the edge surface of an opening of the light blocking portion 12 is arranged at a predetermined angle with the light-receiving surface of the imaging device 22 in a vertical direction. Accordingly, noise light such as flare and ghost caused due to light reflected on the edge surface of the opening of the light blocking portion 12 is reduced.

Incidentally, as shown in the top portion of FIG. 1, if the laminated material 21 is arranged so that the end portion thereof corresponds to an end portion of the imaging device 22 and a side wall of the laminated material 21, which is an end surface, is formed to be perpendicular to an outer end portion of the imaging device 22 in the effective pixel area, incident light such as light beams L1 and L2 out of light beams that have entered the laminated material 21 passes through the laminated material (optical filter) 21, is processed by the optical filter, and is received by the imaging device 22.

However, a light beam L3 shown in the top portion of FIG. 1 passes through only a part of the laminated material 21. Therefore, the light beam L3 is not sufficiently subject to the filtering effect of the optical filter, and is received by the imaging device 22. As a result, it may be impossible to sufficiently exert the function of the optical filter 21.

In view of the above, as shown in the center of FIG. 1, it is conceivable to provide a laminated material (optical filter) 31 instead of the laminated material (optical filter) 21 to sufficiently exert the function of the optical filter 31 with respect also to the light beam L3. An end portion of the optical filter 31 is protruded toward the outside of the imaging device 22 in the effective pixel area so that the side surface cross-section thereof is formed in a trapezoidal shape.

In this case, however, since the end portion of the laminated material (optical filter) 31 is protruded compared with the outer end portion of the imaging device 22 in the effective pixel area, the position of the pad portion 25 is away from the outer end portion of the imaging device 22 in the effective pixel area. Therefore, the size of the substrate 23 needs to be increased. As a result, the size of chips in the image sensor may be increased.

In view of the above, as shown in the bottom of FIG. 1, it is conceivable to provide a laminated material (optical filter) 41 such that the end portion of the laminated material (optical filter) 31 is close to the end portion of the imaging device 22.

Also in this case, however, as shown in the bottom of FIG. 1, because the light beams L2 and L3 are not sufficiently transmitted through the laminated material (optical filter) 41, it may be impossible to sufficiently exert the function of the optical filter.

The present disclosure has been made in view of the above circumstances, and thus there is a need to enable an imaging element to receive a light beam, which sufficiently exerts the function of an optical filter while reducing noise light such as flare and ghost, particularly.

According to an embodiment of the present disclosure, there is provided an imaging apparatus that forms an image of a light beam transmitted through an imaging lens on an imaging element, including a laminated material that is provided on the imaging element, the light beam being transmitted through the laminated material, the laminated material being provided at a position at which an end portion of an upper surface of the laminated material allows an outermost light beam out of light beams to be transmitted therethrough, the light beams entering a pixel in an outer end portion of the imaging element in an effective pixel area, the position having a width Hopt.

The width Hopt of the laminated material that allows the outermost light beam to be transmitted therethrough may be represented based on a thickness of the laminated material, a focal length of a lens, an F-number of the lens, and an image height of an image sensor, by the following formula: Hopt=T*(f−2*H*Fno)/(2*f*Fno+H) in which T, f, Fno, and H represent the thickness of the laminated material, the focal length of the lens, the F-number of the lens, and the image height of the image sensor, respectively.

Based on, in addition to the thickness of the laminated material, the focal length of the lens, the F-number of the lens, and the image height of the image sensor, a refractive index in an area adjacent to an upper side of the laminated material, a refractive index of the laminated material, and a one side angle of incident light beams, the width Hopt may be represented by the following formula: Hopt=T*√{(n2−n*n' sin(θFno))/(n'2−n*n' sin(θFno))}*(f−2*H*Fno)/(2*f*Fno+H) in which n, n', and θFno represent a refractive index in an area adjacent to an upper side of the laminated material, a refractive index of the laminated material, and a one side angle of incident light beams having an F-number of Fno.

The laminated material may have a side wall inclined angle θtilt, and the side wall inclined angle θtilt may satisfy the following formula: n'*sin(θE)−(2*n)/n'*sin 2(θA)−n*sin (θA)*sin(θE)<1 in which θA and θE represent an incident angle on the laminated material and 90−θtilt, respectively.

A position of an end portion of a lower surface of the laminated material may be located on a side of the effective pixel area nearer than a position of the end portion of the upper surface thereof.

The upper surface of the laminated material may have a width larger than one of a width obtained by adding the effective pixel area, the width Hopt, and a lithography tolerance and a width obtained by adding the effective pixel area, the width Hopt, the lithography tolerance, and bonding accuracy of the laminated material.

The laminated material may be in contact with the imaging element via an adhesive layer having a width larger than one of the width obtained by adding the effective pixel area, the lithography tolerance, and the bonding accuracy of the laminated material and a width of a lower surface of the laminated material, whichever is larger.

The laminated material may be an optical filter.

According to an embodiment of the present disclosure, there is provided a camera system including an imaging apparatus that forms an image of a light beam transmitted through an imaging lens on an imaging element, the imaging apparatus including a laminated material that is provided on the imaging element, the light beam being transmitted through the laminated material, the laminated material being provided at a position at which an end portion of an upper surface of the laminated material allows an outermost light beam out of light beams to be transmitted therethrough, the light beams entering a pixel in an outer end portion of the imaging element in an effective pixel area, the position having a width Hopt.

The width Hopt of the laminated material that allows the outermost light beam to be transmitted therethrough may be represented based on a thickness of the laminated material, a focal length of a lens, an F-number of the lens, and an image height of an image sensor, by the following formula: Hopt=T*(f−2*H*Fno)/(2*f*Fno+H) in which T, f, Fno, and H represent the thickness of the laminated material, the focal length of the lens, the F-number of the lens, and the image height of the image sensor, respectively.

A position of an end portion of a lower surface of the laminated material may be located on a side of the effective pixel area nearer than a position of the end portion of the upper surface thereof.

The laminated material may be an optical filter.

According to an embodiment of the present disclosure, it is possible to sufficiently exert the function of an optical filter while reducing noise light such as flare and ghost.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings. It should be noted that the description will be given in the following order.
1. First embodiment (example in which an optically-necessary width is set in a laminated material)
2. Second embodiment (example in which an optically-necessary width is set by providing a reverse-tapered portion, i.e., making the upper side of a laminated material large)
3. Third Embodiment (example in which an optically-necessary width is set by providing a tapered portion, i.e., making the upper side of a laminated material small)
4. Fourth Embodiment (example in which an optically-necessary width and a lithography tolerance are taken into account)
5. Fifth Embodiment (example in which an optically-necessary width, a lithography tolerance, and bonding accuracy are taken into account)
6. Sixth Embodiment (example in which an optically-necessary width, a lithography tolerance, bonding accuracy, and an adhesive layer are taken into account)
7. Seventh Embodiment (example in which an optically-necessary width, a lithography tolerance, bonding accuracy, and an adhesive layer in a laminated body in a reverse-tapered shape are taken into account)
(1. First Embodiment)

Figure 2:
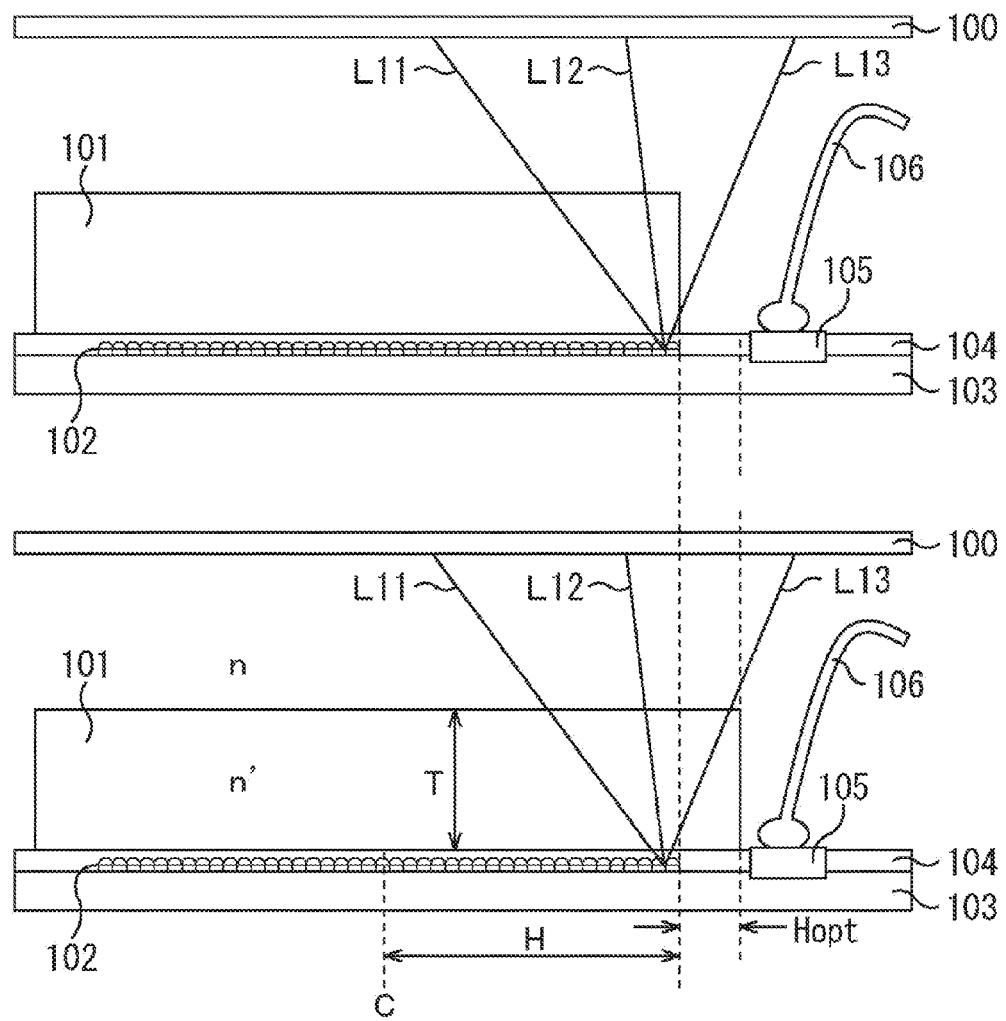
FIG. 2 is a diagram showing a configuration example of an imaging apparatus according to an embodiment of the present disclosure.

The top and bottom of FIG. 2 each show a configuration example of a side surface cross-section in the vicinity of an imaging device in an imaging apparatus (camera or camera system). On a substrate 103 including a resin material, an imaging device 102 including a CMOS (Complementary Metal Oxide Semiconductor), a CCD (Charged Coupled Device), or the like is formed. On the imaging device 102, a wiring layer 104 that transfers a pixel signal is formed. On the upper portion of the wiring layer 104, a laminated material 101 including an optical filter is laminated. On the wiring layer 104, a pad portion 105 electrically connected to a wiring 106 is provided. The pixel signal generated by the imaging device 102 is transferred through the wiring 106.

Incident light that is emitted from above the upper side of FIG. 2 on which a subject exists and is transmitted through a lens 100 is transmitted through the laminated material 101 formed of an optical filter, is optically processed by the optical filter, and then enters the imaging device 102. By photoelectrically converting the incident light, the imaging device 102 generates a pixel signal formed of an electric signal and outputs, via the wiring layer 104, the pixel signal through the wiring 106 connected to the pad portion 105.

It should be noted that as shown in the top of FIG. 2, when incident light beams L11 to L13 out of light beams that have entered the laminated material 101 enter the end portion of the laminated material 101 and an outer end portion of the imaging device 102 in the effective pixel area, the incident light beams L11 and L12 are transmitted through the laminated material 101 from the upper surface of FIG. 2 to the lower surface of FIG. 2. Therefore, the incident light beams L11 and L12 are sufficiently processed by the optical filter and then enter the imaging device 102. However, the incident light beam L13 enters the laminated material 101 from a side wall of thereof, is transmitted through only a part of the laminated material 101, and then enters the imaging device 102. In this case, since the incident light beam L13 is transmitted through only a part of the laminated material 101, the incident light beam L13 is not sufficiently processed by the optical filter and then enters the imaging device 102. As a result, in the vicinity of the end portion of the imaging device 102, a pixel signal is generated by incident light that has not sufficiently processed by the optical filter. Therefore, a signal that is optically degraded as compared with a pixel signal in other areas may be generated.

As shown in the lower portion of FIG. 2, in order to prevent a pixel signal from being degraded due to light that is not sufficiently processed by the optical filter as described above, there is a need to provide the laminated material 101 having a large size such that the laminated material 101 protrudes as compared with the imaging device 102 so as not to interfere with the pad portion 105. With such a configuration, as shown in the lower portion of FIG. 2, since the end portion of the laminated material 101 protrudes as compared with the imaging device 102 in the effective pixel area, it is possible to cause any one of the incident light beams L11 to L13 that has entered the outer end portion of the imaging device 102 in the effective pixel area to be transmitted through the laminated material 101 from the upper surface to the lower surface thereof. Therefore, it is possible to sufficiently exert the function of the laminated material 101 as an optical filter.

Figure 1:
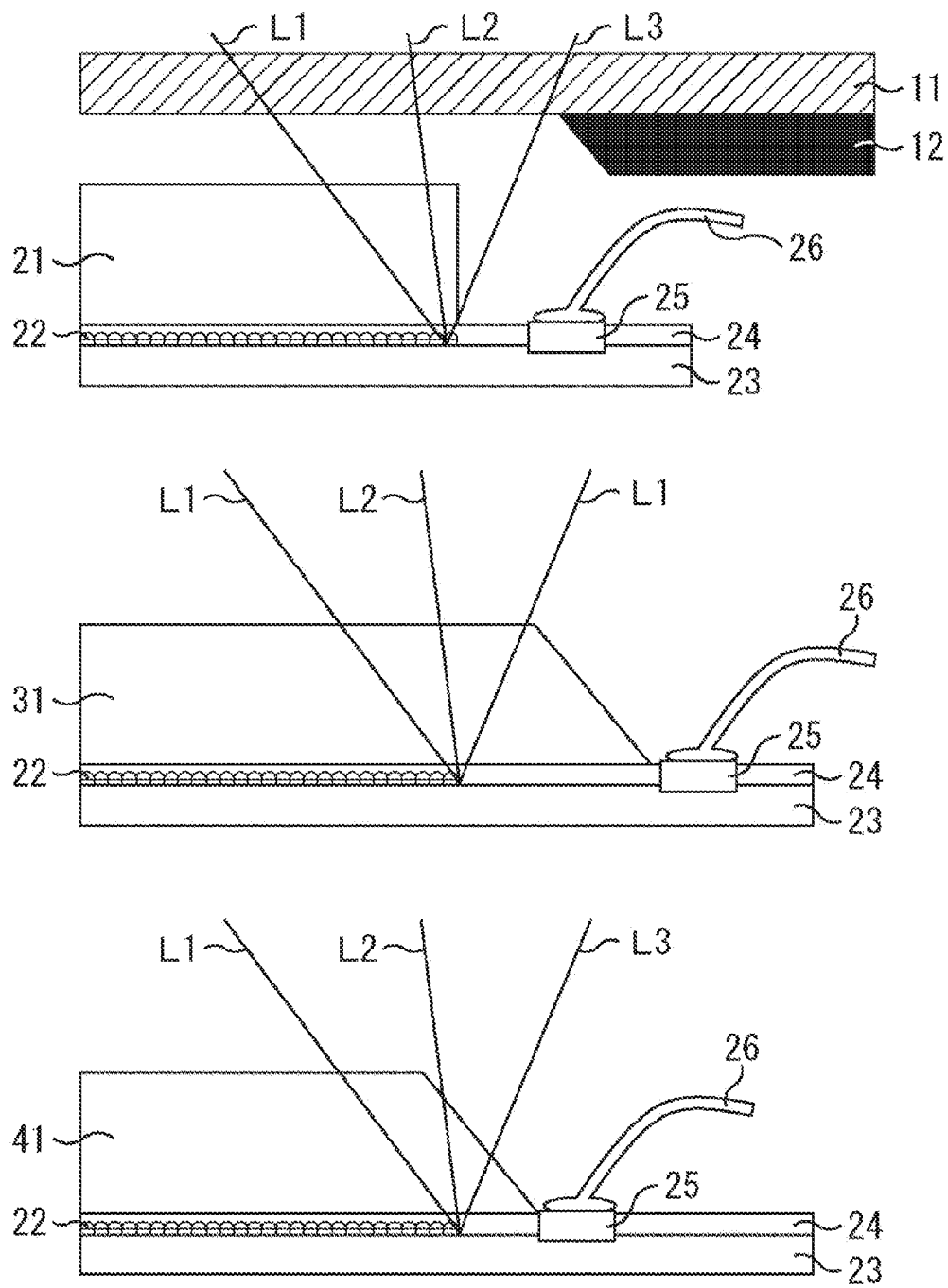
FIG. 1 is a diagram showing a configuration example of an existing imaging apparatus.

In the following description, a length (protruding amount) in which the laminated material 101 protrudes from the end portion of the imaging device 102 at the end portion of the laminated material 101 is referred to also as "optically-necessary width Hopt," and is described as "Hopt" as shown in the lower portion of FIG. 1. The same shall apply to the other figures.
(Setting of Optically-necessary Width)

The optically-necessary width Hopt needs to be set to a length in which the laminated material 101 does not interfere with the pad portion 105 and the entire size of the chip configuration is not too large unnecessarily. More specifically, the optically-necessary width Hopt is set such that an outermost light beam out of light beams that have entered the imaging device 102 from the lens 100, which form an image on the imaging device 102 and enter a pixel that performs photoelectric conversion on light at the outermost periphery of the imaging device 102 in the effective pixel area is transmitted through the end portion of the upper surface of the laminated material (optical filter or the like) 101 that is in contact with the imaging device 102.

Now, a specific method of setting the optically-necessary width Hopt will be described.

An F-number Fno of the lens 100 through which incident light that enter the imaging device 102 via the laminated material 101 is transmitted will be described first. The F-number Fno is represented by the following equation (1). Specifically, as shown in the left portion of FIG. 3, the F-number Fno is a value obtained by dividing a focal length f of a lens D by an effective diameter D.

$$F_{no} = \frac{f}{D} \quad (1)$$

Figure 3:
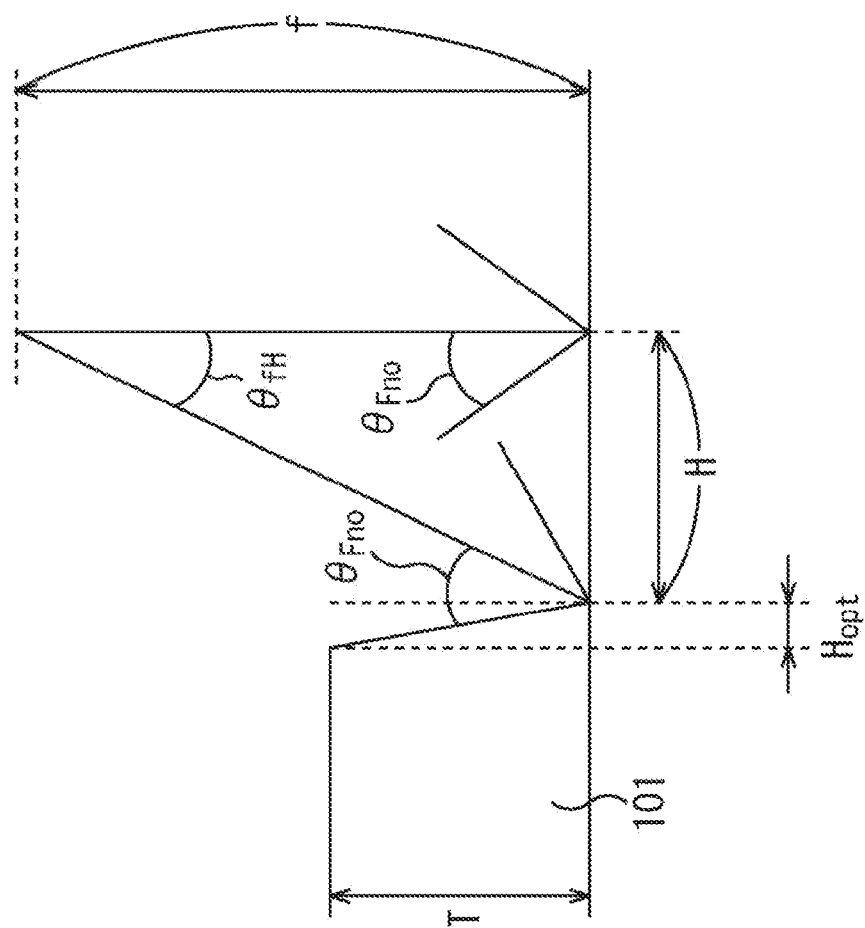
FIG. 3 is a diagram for explaining an optically necessary width (protruding amount)
Figure 3:
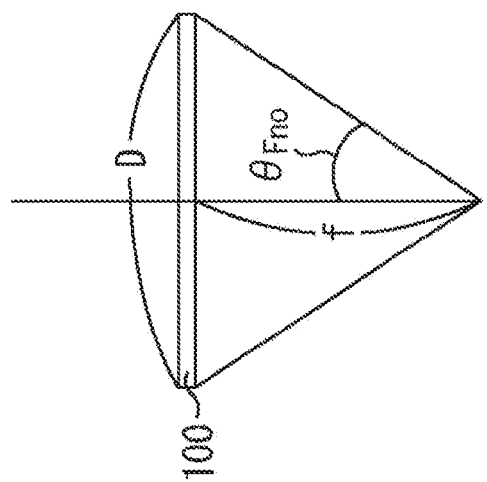

At this time, as shown in the left portion of FIG. 3, when an angle between a straight line extending from an end portion of the effective diameter to the focal position and the optical axis (one side angle of light beams having the F-number) is an angle θFno, tan(θFno) is represented by the following equation (2).

$$\frac{\frac{1}{2}D}{f} = \tan\theta_{Fno} \quad (2)$$

Based on these conditions, the optically-necessary width Hopt is set as shown in the right portion of FIG. 3.

It should be noted that in the right portion of FIG. 3, H represents the image height in the focal length of the lens 100, and T represents the thickness of the laminated material 101 formed of an optical filter. Moreover, θfH is an angle between a light beam direction of one side angle θFno of light beams having the F-number with respect to an outermost light beam of light beams that enter a pixel that performs photoelectric conversion on light at the outermost periphery of the imaging device 102 and an optical axis direction. Therefore, tan(θfH) is represented by the following equation (3).

$$\tan\theta_{fH} = \frac{H}{f} \quad (3)$$

Moreover, when the equation (2) is modified, tan(θFno) is represented by the following equation (4).

$$\tan\theta_{Fno} = \frac{1}{2F_{no}} \quad (4)$$

Furthermore, as shown in the right portion of FIG. 3, the optically-necessary width Hopt is represented by the following equation (5).

if $\theta_{Fno} > \theta_{fH}$ $$\tan(\theta_{Fno} - \theta_{fH}) \times T = H_{opt} \quad (5)$$

Here, when the equation (3) and the equation (4) are applied to tan(θFno) and tan(θfH) in the equation (5), the optically-necessary width Hopt is obtained as shown in the following equation (6).

$$H_{opt} = T \times \frac{\tan\theta_{Fno} - \tan\theta_{fH}}{1 + \tan\theta_{Fno} \times \tan\theta_{fH}} \quad (6)$$

$$= T \times \frac{\frac{1}{2F_{no}} - \frac{H}{f}}{1 + \frac{1}{2F_{no}} \times \frac{H}{f}}$$

$$= T \times \frac{\frac{f - 2F_{no}H}{2F_{no}f}}{1 + \frac{H}{2F_{no}f}}$$

$$= T \times \frac{f - 2F_{no}H}{2F_{no}f + H}$$

As described above, it is possible to set the optically-necessary width Hopt to an appropriate value with the thickness T of the laminated material 101 formed of an optical filter, the focal length f of the lens 100, the F-number Fno, and the image height H.

Moreover, as shown in the equation (6), the optically-necessary width Hopt takes the maximum value when the focal length f is infinite or in a telecentric optical system, and is set as shown in the following equation (7).

$$H_{opt} = T \times \tan\theta_{Fno} = T \times \frac{1}{2F_{no}} \quad (7)$$

It should be noted that the optically-necessary width Hopt set by the equations (6) and (7) takes a simplified value in the case where the optical filter of the laminated material 101 has a refractive index of 1.

In view of the above, by setting a thickness t' of the laminated material 101 taking into account of a refractive index instead of the thickness T of the laminated material 101 with no consideration of a refractive index, it is possible to set the optically-necessary width Hopt to a value taking into account a refractive index as shown in the following equation (8).

$$H_{opt} = t \times \frac{f - 2F_{no}H}{2F_{no}f + H} \quad (8)$$

Here, t represents a thickness at which incident light arrives in the laminated material 101 with no consideration of a refractive index at the same incident position as that of the thickness t' taking into account a refractive index, and represents a thickness in the same position in the horizontal direction when the incident light arrives at a lower surface of the laminated material 101 taking into account a refractive index. More specifically, the thickness t can be described as below.

Figure 4:
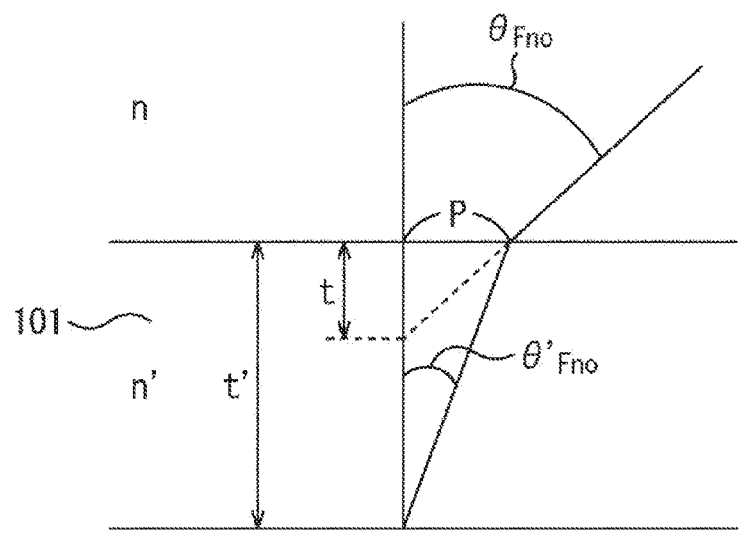
FIG. 4 is a diagram for explaining an optically-necessary width taking into account the refraction.

Specifically, as shown in FIG. 4, a refractive index in upper space of the laminated material 101 is assumed to be n and a refractive index in space in the laminated material 101 is assumed to be n'. With refraction, the one side angle θFno of light beams having the F-number of upper space of the laminated material 101 takes an angle θ'Fno in the laminated material 101. Here, a position of the lower surface of the laminated material 101 at which light that has entered the boundary of the upper surface of the laminated material 101 from the area above the laminated material 101 arrives with the optical axis of the laminated material 101 by refraction is assumed to be an optical axis, a distance from the position of the incident light on the upper surface to the optical axis is a distance p, and a distance in the optical axis direction from the upper surface of the laminated material 101 to an intersection point between the optical axis and light that has been transmitted without refraction at the incident position is a distance t, which is the thickness t. In addition, at this time, a thickness of the laminated material 101 taking into account a refractive index is the thickness t'.

It should be noted that based on the law of refraction (Snell's law), the following equation (9) is established.

$$n \sin \theta_{Fno} = n' \sin \theta'_{Fno} \qquad (9)$$

Moreover, based on the relationships between the distances p, t, and t' and the angles θFno and θ'Fno, the following equations (10) and (11) are established.

$$P = t \tan \theta_{Fno} \qquad (10)$$

$$P = t' \tan \theta'_{Fno} \qquad (11)$$

Furthermore, based on the relationship between the equation (10) and the equation (11), the following equation (12) is established.

$$t \tan \theta_{Fno} = t' \tan \theta'_{Fno} \qquad (12)$$

Here, the equation (9) is modified to obtain x represented by the following equation (13). In this case, tan (θ'Fno) is represented by the following equation (14).

$$\sin \theta'_{Fno} = \frac{n}{n'} \sin \theta_{Fno} = x \qquad (13)$$

$$\tan \theta'_{Fno} = \pm \frac{x}{\sqrt{1-x^2}} \qquad (14)$$

Moreover, the equation (9) is modified to obtain y represented by the following equation (15). In this case, tan (θFno) is represented by the following equation (16).

$$\sin \theta'_{Fno} = \frac{n'}{n} \sin \theta'_{Fno} = \frac{n'}{n} x = y \qquad (15)$$

$$\tan \theta_{Fno} = \pm \frac{y}{\sqrt{1-y^2}} \qquad (16)$$

When the equation (14) and the equation (16) are applied to the equation (12), the following equation (17) is established.

$$t \times \left( \pm \frac{y}{\sqrt{1-y^2}} \right) = t' \times \left( \pm \frac{x}{\sqrt{1-x^2}} \right) \qquad (17)$$

It should be noted that the left side can be modified to the following equation (18).

$$\text{Left side} = t \times \left( \pm \frac{\frac{n'}{n} x}{\sqrt{1-\frac{n'^2}{n'}x^2}} \right) = t \times \left( \frac{n' x}{\sqrt{n^2 - n'^2 x^2}} \right) \qquad (18)$$

Furthermore, when the modified left side represented by the equation (18) is applied to the equation (17), the following equation (19) is established.

$$\pm t \times \frac{n' x}{\sqrt{n^2 - n'^2 x^2}} = \pm t' \times \left( \frac{x}{\sqrt{1-x^2}} \right) \qquad (19)$$

It should be noted that when the equation (1) is solved for a coefficient t, the following equation (20) is established.

$$t = t' \times \sqrt{\frac{\frac{n^2}{n'^2} - \frac{n}{n'} \sin \theta_{Fno}}{1 - \frac{n}{n'} \sin \theta_{Fno}}} \qquad (20)$$

$$= t' \times \sqrt{\frac{n^2 - n n' \sin \theta_{Fno}}{n'^2 - n n' \sin \theta_{Fno}}}$$

Here, the refractive index n in upper space of the laminated material 101 is assumed to be 1. The coefficient t is represented by the following equation (21).

$$t = t' \times \sqrt{\frac{1 - n' \sin \theta_{Fno}}{n'^2 - n' \sin \theta_{Fno}}} \qquad (21)$$

As described above, in the case where a refractive index is taken into account, it is possible to set the optically-necessary width Hopt to an appropriate value with the refractive index n in upper space of the laminated material 101 and the refractive index n' in space in the laminated material 101 in addition to the thickness t' of the laminated material 101, the focal length f of the lens 100, the F-number Fno, and the image height H.

By setting the optically-necessary width Hopt as described above, as shown in the lower portion of FIG. 2, the light beam L3, which has a difficulty of being transmitted through the laminated material 101 in the configuration shown in the upper portion of FIG. 2, in addition to the light beams L1 and L2, can be transmitted through the laminated material 101 from the upper surface to the lower surface thereof. Therefore, it is possible to sufficiently exert the function of the laminated material 101 as an optical filter.

(2. Second Embodiment)

Incidentally, if the optically-necessary width Hopt is set such that the light beams L1, L2, and L3 are transmitted through the laminated material 101 from the upper surface to the lower surface thereof as shown in FIG. 2, because the laminated material 101 is provided in such a way that the lower surface thereof does not interfere with the pad portion 105, the number of image sensors that can be produced from a silicon wafer is decreased.

However, as shown in FIG. 2, in the case where the light beams L1 to L3 are transmitted through the laminated material 101 from the upper surface to the lower surface thereof, the optically-necessary width Hopt needs to be set for only the upper surface of the laminated material 101. The optically-necessary width Hopt does not necessarily need to be set for the lower surface of the laminated material 101.

Figure 5:
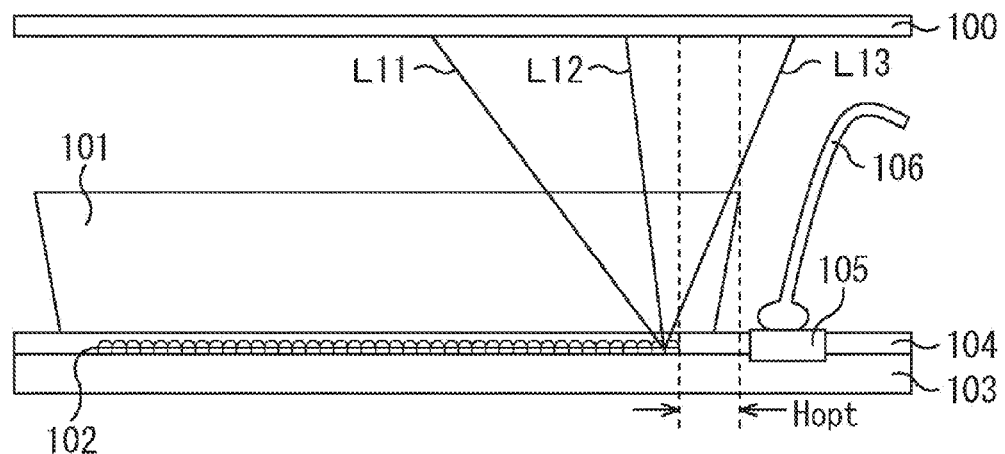
FIG. 5 is a diagram for explaining a laminated material in a reverse-tapered shape.

In view of the above, as shown in FIG. 5, the optically-necessary width Hopt may be set for only the upper surface of the laminated material 101, and the lower surface of the laminated material 101 may extend within the range from the end portion of the imaging device 102 to a portion at which the laminated material 101 does not interfere with the pad portion 105. In this way, it is possible to make the pad portion 105 closer to the imaging device 102. The necessary area of the substrate 103 can be reduced, and thus the number of image sensors that can be produced from a silicon wafer can be increased.

(3. Third Embodiment)

Figure 6:
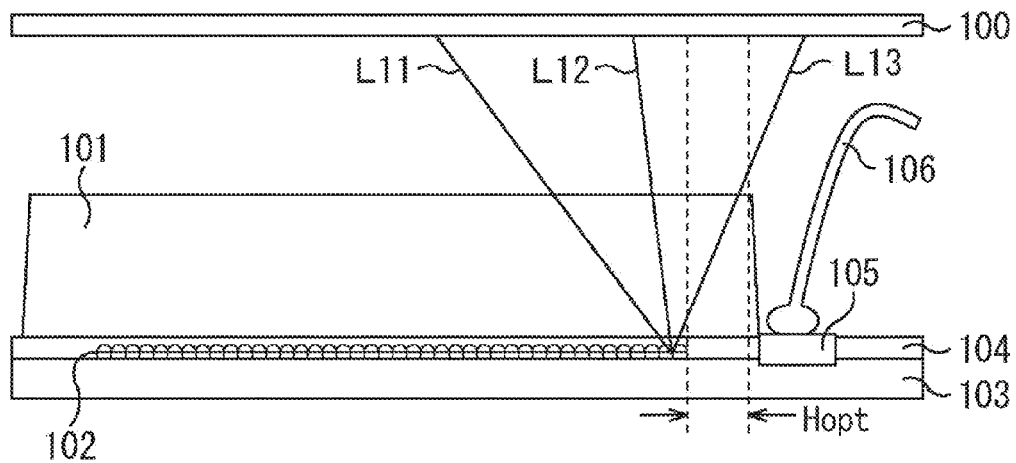
FIG. 6 is a diagram for explaining a laminated material in a tapered shape.

Moreover, based on the similar reason, the width of the lower surface may be larger than the optically-necessary width Hopt as long as the optically-necessary width Hopt is set for the upper surface of the laminated material 101. Therefore, as shown in FIG. 6, the lower surface may be larger than the upper surface.

It should be noted that when the laminated material 101 is produced, after the laminated material 101 is applied to the imaging device 102 of a silicon wafer by spin-coating or the like and is cured, there is a need to remove the laminated material 101 in the case where it is necessary to provide an opening or the like for the pad portion 105 for energization on the imaging device 102. As shown in FIG. 6, in the case where an unnecessary portion in the laminated material 101 is removed with a lithography technique and an etching technique in a semiconductor, it is difficult to make the shape of the side surface of the laminated material 101 a trapezoidal shape (structure in which the upper surface is narrower than the lower surface). However, as shown in FIG. 5, it is possible to easily make the structure of an inverted trapezoidal shape (structure in which the upper surface is wider than the lower surface). Moreover, the easiness of the formation exerts an influence on manufacturing (developing) cost or stability of manufacturing variability. Thus, from viewpoints of optical properties of the laminated material 101, the number of the laminated material 101 that can be produced, and the difficulty of the manufacturing, the shape of the laminated material 101 is favorably the inverted trapezoidal shape shown in FIG. 5.

(4. Fourth Embodiment)

Figure 7:
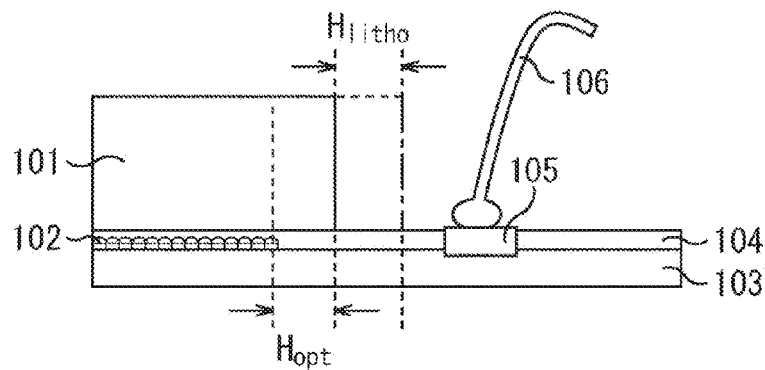
FIG. 7 is a diagram for explaining a configuration example in the case where an optically-necessary width and a lithography tolerance are taken into account.

In the above description, the example in which the optically-necessary width Hopt is set for the upper surface of the laminated material 101 has been described. However, for example, for the position at which the laminated material 101 is set, a lithography (including etching) tolerance may be taken into account. Specifically, as shown in FIG. 7, a width obtained by adding a lithography tolerance Hlitho to the optically-necessary width Hopt may be set between the end portion of the imaging device 102 and the pad portion 105 so that the upper surface of the laminated material 101 protrudes from the outer end portion of the imaging device 102 in the effective pixel area. Specifically, "the optically-necessary width Hopt+the lithography tolerance Hlitho" may be set as a width from the outer end portion of the imaging device 102 in the effective pixel area to the end portion of the upper surface of the laminated material 101. With such setting, it is possible to sufficiently exert the function of the laminated material 101 as an optical filter, and to alleviate the lithography (including etching) tolerance.

(5. Fifth Embodiment)

Figure 8:
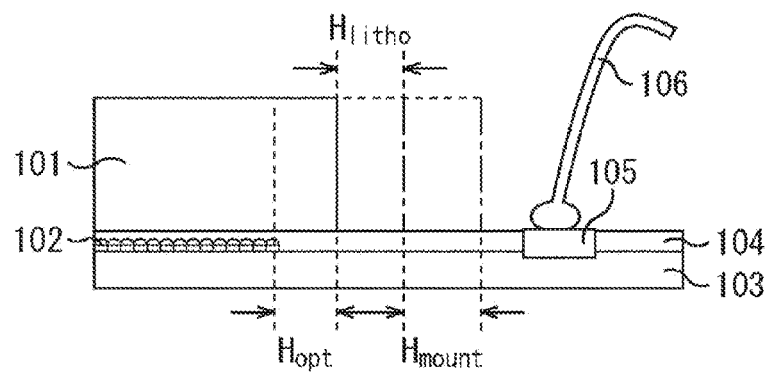
FIG. 8 is a diagram for explaining a configuration example in the case where an optically-necessary width, a lithography tolerance, and bonding accuracy are taken in to account.

Moreover, in the case where the laminated material 101 is placed on the substrate 103 by being bonded thereto, a bonding accuracy Hmount may be further added as shown in FIG. 8. Specifically, a width from the outer end portion of the imaging device 102 in the effective area to the end portion of the upper surface of the laminated material 101 may be set to "the optically-necessary width Hopt+the lithography tolerance Hlitho+the bonding accuracy Hmount." With such setting, it is possible to sufficiently exert the function of the laminated material 101 as an optical filter, and to alleviate not only the lithography (including etching) tolerance but also the errors due to the bonding.

(6. Sixth Embodiment)

Figure 9:
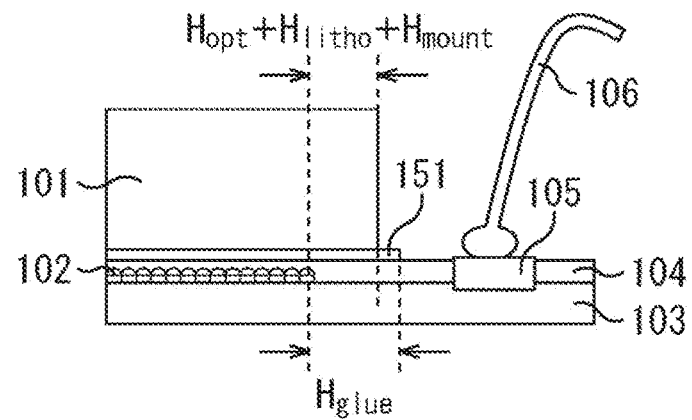
FIG. 9 is a diagram for explaining a configuration example in the case where an optically-necessary width, a lithography tolerance, bonding accuracy, and an adhesive layer are taken into account.

Furthermore, in the case where the laminated material 101 is bonded to the imaging device 102 via an adhesive layer 151, as shown in FIG. 9, by making a width Hglue of the adhesive layer 151 larger than "the optically-necessary width Hopt+the lithography tolerance Hlitho+the bonding accuracy Hmount," it is possible to sufficiently exert the function of the laminated material 101 as an optical filter, and to reliably attach the laminated material 101 on the imaging device 102.

(7. Seventh Embodiment)

Figure 10:
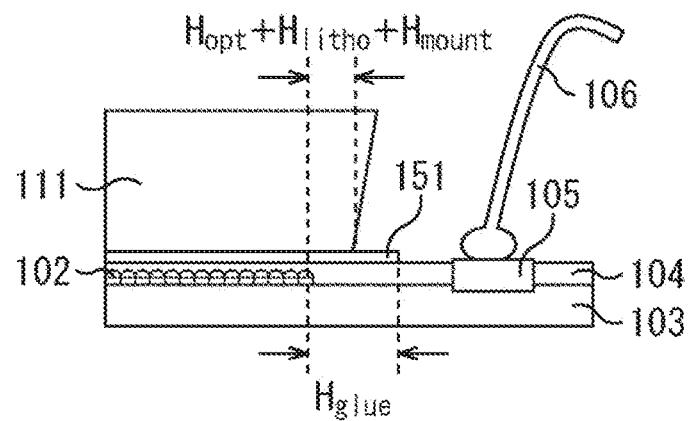
FIG. 10 is a diagram for explaining a configuration example in the case where an optically-necessary width, a lithography tolerance, bonding accuracy, and an adhesive layer in a laminated material in a reverse-tapered shape are taken into account.

Moreover, even in the case where the shape of the side surface cross-section of the laminated material 101 is an inverted trapezoidal shape, as shown in FIG. 10, the width Hglue of the adhesive layer 151 may be larger than "the optically-necessary width Hopt+the lithography tolerance Hlitho+the bonding accuracy Hmount." In this way, it is possible to sufficiently exert the function of the laminated material 101 as an optical filter, and to reliably attach the laminated material 101 on the imaging device 102.

(F-number and Optically-necessary Width (Protruding Amount))

Incidentally, the incidence angle of a principal light beam from the lens 100 to an imaging surface generally is increased as the image height H is high. In the case where the incidence angle is larger than that of the light beams shown in FIG. 2 (the image height is high or the focal length is short), the light beams are incident on the left side as compared with the case of FIG. 2. Therefore, the number of light beams that are not transmitted through the laminated material 101 is reduced.

Figure 11:
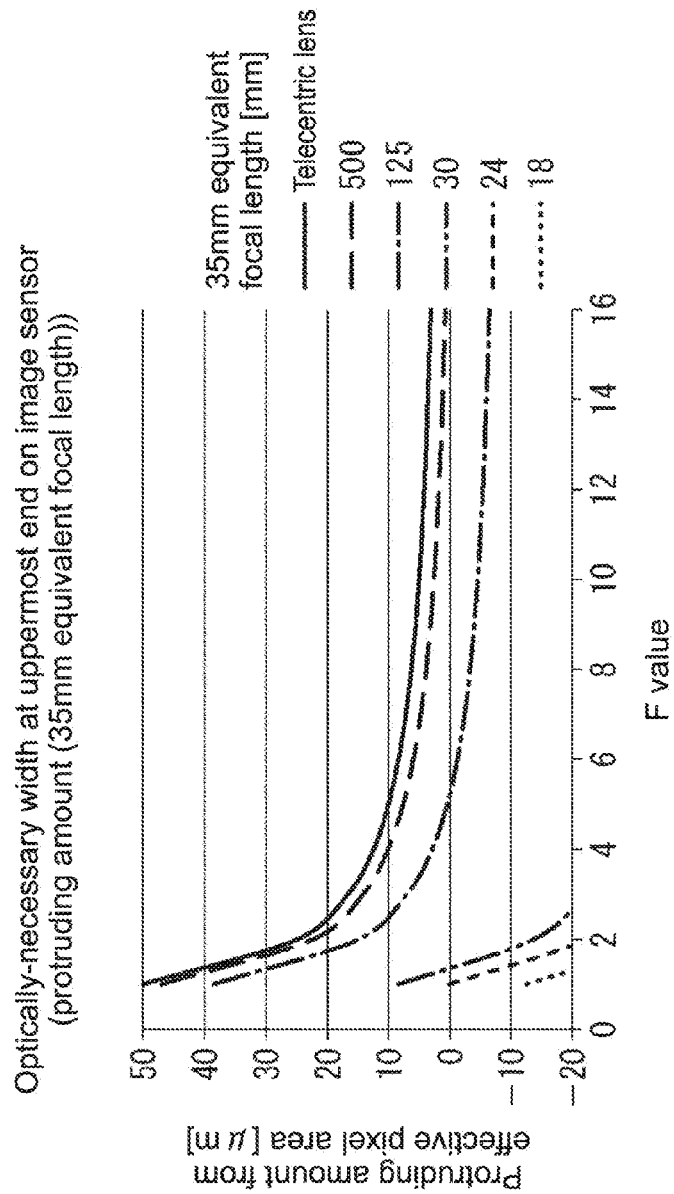
FIG. 11 is a diagram for explaining the relationship between an F-number and an optically-necessary width (protruding amount)
Figure 11:
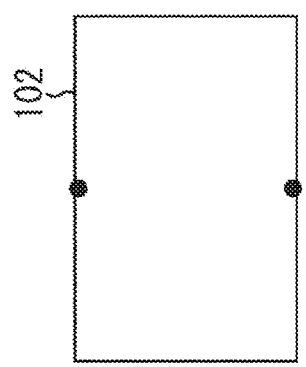

It should be noted that the left portion of FIG. 11 shows the effective pixel area of the imaging device 102 viewed from the upper surface, and points shown at the center of the upper end and the center of the lower end of the imaging device 102 represent positions in the side wall of the laminated material 101 at which the incidence angle of light beams is the smallest (the number of light beams that have not been transmitted through the laminated material 101 is the largest).

The right portion of FIG. 11 is a graph showing the relationship between the F-number Fno (1 to 16) and the optically-necessary width Hopt in the case where the 35 mm equivalent focal length in the image height H of the imaging device 102 shown in the left portion of FIG. 11 using the equation (6) is 12 mm, and the thickness of the laminated material 101 is 100 μm.

As shown in the graph of the right portion of FIG. 11, because, in the case where the F-number Fno is 1 and the 35 mm equivalent focal length is 24 mm, the optically-necessary width Hopt is 0 μm, there is a need to take into account the optically-necessary width Hopt+the lithography tolerance Hlitho+the bonding accuracy Hmount if the 35 mm equivalent focal length of the lens 100 is longer than 24 mm. On the other hand, in the case where the 35 mm equivalent focal length of the lens 100 is shorter than 24 mm, there is no need of the optically-necessary width Hopt. It only needs to take into account the lithography tolerance Hlitho+the bonding accuracy Hmount. It should be noted that in the right portion of FIG. 11, as shown in the right area thereof, the lines represent wavelengths of a telecentric lens and lenses having the 35 mm equivalent focal lengths of 500 mm, 125 mm, 30 mm, 24 mm, and 18 mm from the above.

Moreover, in the case of the telecentric lens, the incidence angle of principal light beam is 0 degree (perpendicular) regardless of the focal length and the optically-necessary width Hopt is the largest. In this case, the above-mentioned equation (7) is used to calculate the optically-necessary width Hopt.

(Influence of Tapered Shape)

As shown in FIGS. 5 to 10, the shape of the side surface cross-section of the laminated material 101 may be any one of an inverted trapezoidal shape or a trapezoidal shape. In the following description, these shapes are also referred to as a reverse-tapered shape and a tapered shape, respectively.

Figure 12:
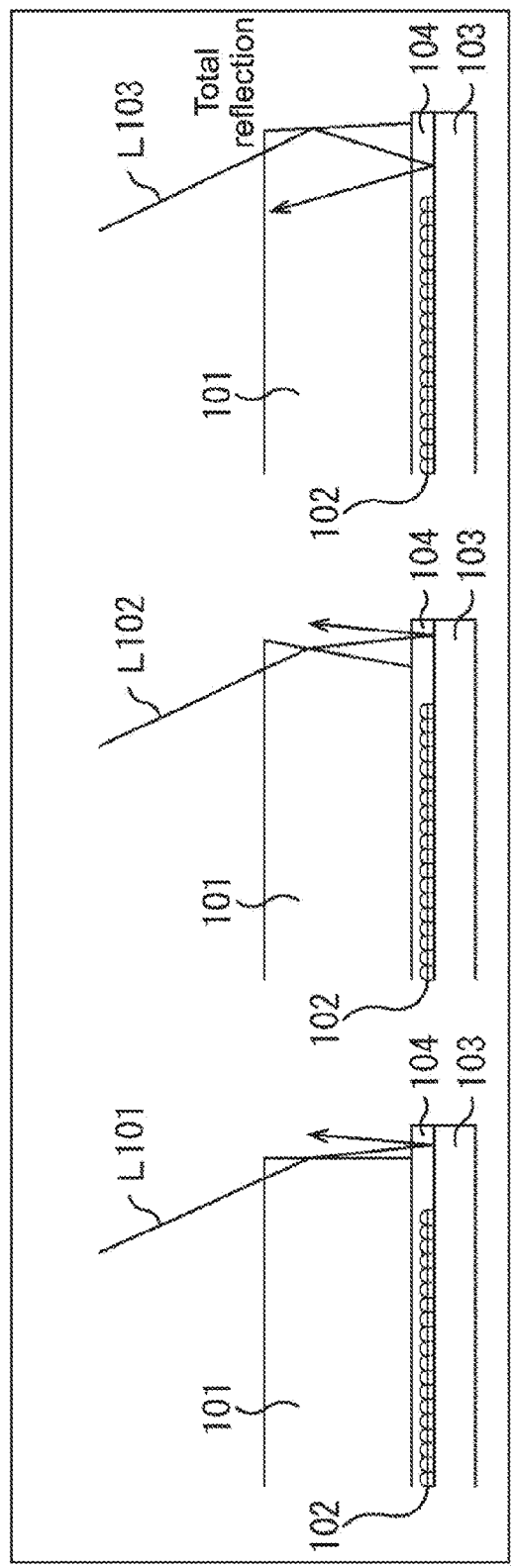
FIG. 12 is a diagram for explaining the principle of noise caused due to total reflection.

It should be noted that when a light beam that has entered the upper surface of the laminated material 101 having a tapered shape or a reverse-tapered shape enters the side wall (e.g., position indicated by a point shown in the left portion of FIG. 11), as shown in the left portion and center portion of FIG. 12, an incident light L101 and an incident light L102 enter the side wall, are refracted on the side wall, are transmitted through the laminated material 101, and go out from the laminated material 101 in some cases, depending on the incidence angle. On the other hand, as shown in the right portion of FIG. 12, if an incident light L103 is totally reflected and travels in the laminated material 101, the incident light L103 reaches the effective pixel area, which may exert an influence as noise light such as ghost and flare.

Figure 13:
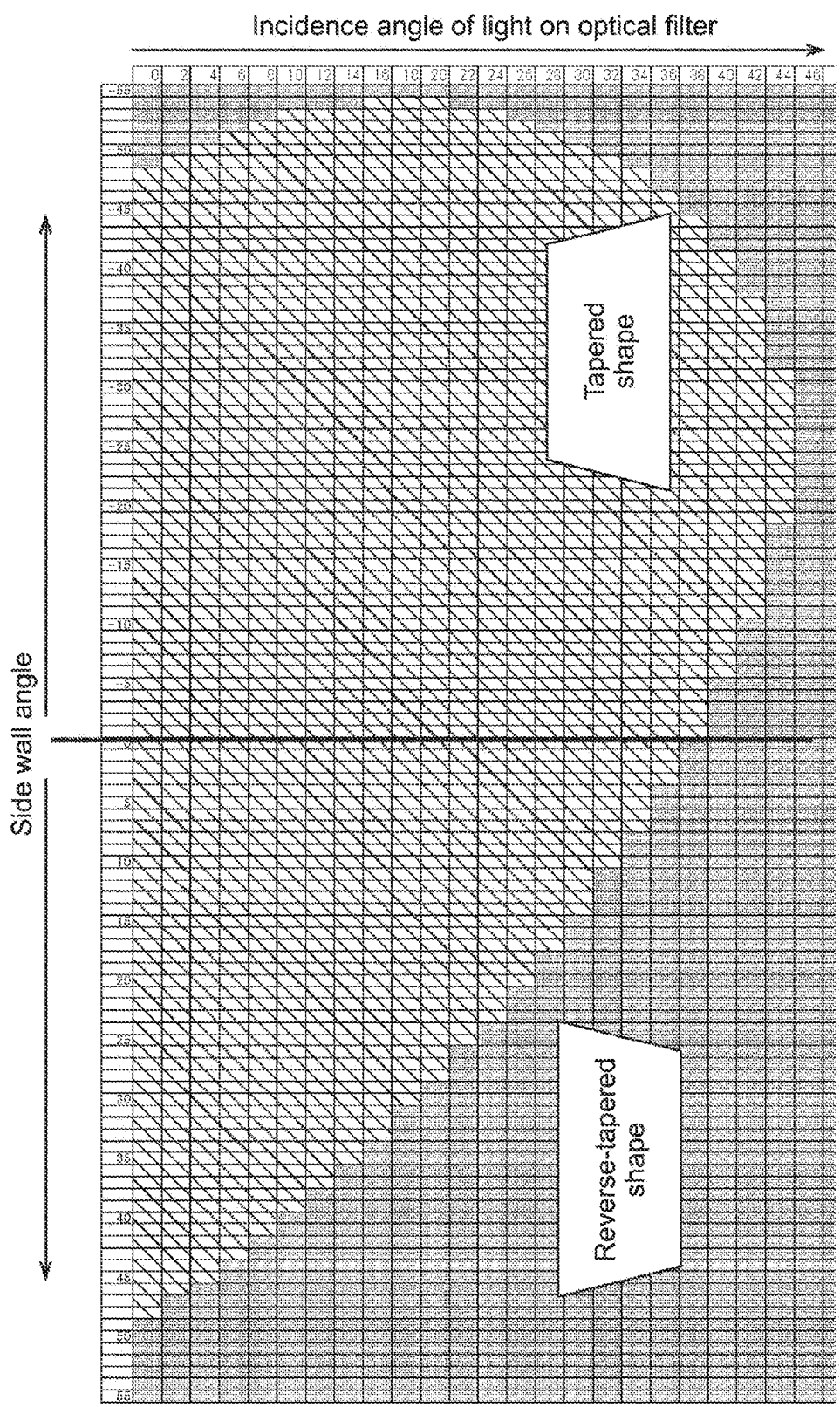
FIG. 13 is a diagram for explaining the relationship between the angle of a side wall and an incidence angle.

FIG. 13 shows the distribution of the case where light is totally reflected and the case where light is not totally reflected depending on conditions including the incidence angle from the upper surface of the laminated material (optical filter or the like) 101 and the inclined angle of the side wall. It should be noted that in FIG. 13, the horizontal axis represents an inclined angle with respect to the optical axis of the side wall, and the vertical axis represents the incidence angle. In addition, distribution of the shaded area represents the area in which light is totally reflected and distribution of the gray area represents the area in which light is not totally reflected. Here, the refractive index of the laminated material is assumed to be 1.5, and the refractive index of air is assumed to be 1. In this case, the surface reflectance is about 4%. On the other hand, in the case of the total reflection, because almost all of the optical energy is stored, totally reflected light exerts a significant influence as noise light such as ghost. Accordingly, it is favorable to slope the side wall under the conditions where light is not totally reflected. Therefore, the distribution shown in FIG. 13 represents that noise light such as ghost and flare is liable to be reduced with the shape of the laminated material 101 being a reverse-tapered shape because the area in which light is not totally reflected is wide in the case where the shape of the laminated material 101 is a reverse-tapered shape as compared with the case where the shape of the laminated material 101 is a tapered shape.

(Conditions where Light is not Totally Reflected)

Figure 14:
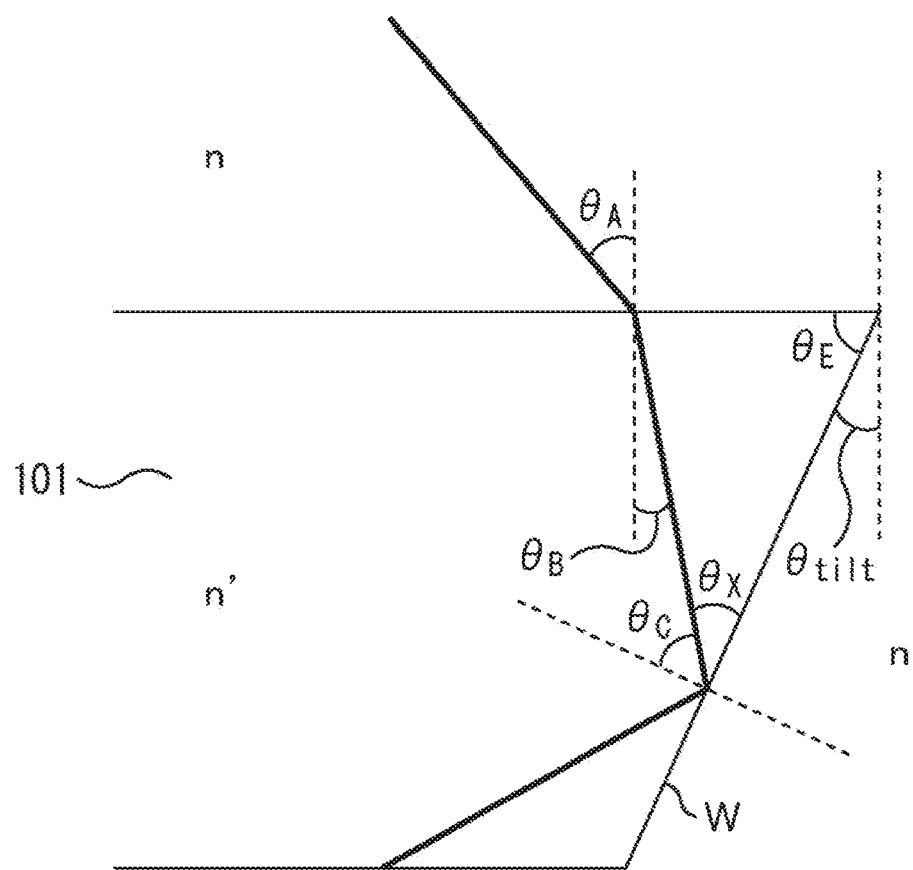
FIG. 14 is a diagram for explaining the conditions of the total reflection of light on the side wall.

Next, with reference to FIG. 14, the conditions in which light is not totally reflected will be described. It should be noted that FIG. 14 shows the conditions where incident light is totally reflected in the vicinity of a side wall W of the laminated material 101 having a reverse-tapered shape. Here, the incidence angle of a light beam to the laminated material 101 is assumed to be an angle $\theta A$, the refraction angle of a light beam whose incident angle is the angle $\theta A$ is assumed to be a refraction angle $\theta B$, angle to be the incident angle of a light beam whose refraction angle is the refraction angle $\theta B$ to the side wall W is an angle $\theta C$, the inclined angle of the side wall W of the laminated material 101 with respect to the optical axis is assumed to be an inclined angle $\theta tilt$, a refractive index in the laminated material 101 is assumed to be refractive index $n'$, and a refractive index in the outside of the laminated material 101 is assumed to be the refractive index n. Moreover, an angle $\theta E$ between the upper surface of the laminated material 101 and the inclining portion of the side wall W is assumed to be $90° - \theta tilt$, and an angle $\theta X$ between a light beam whose incidence angle is the angle $\theta C$ and the inclining portion of the side wall W is assumed to be $90° - \theta C$. At this time, a light beam that has entered the laminated material 101 is totally reflected on the inclining portion of the side wall, which causes ghost or flare in an image. In view of the above, in order to reduce the ghost or flare, the conditions where the light that has entered the laminated material 101 is not totally reflected on the inclining portion of the side wall need to be satisfied.

Here, based on the Snell's law, the following equation (22) is established from the relationship of FIG. 14.

$$n \sin \theta_A = n' \sin \theta_B \qquad (22)$$

Moreover, from FIG. 14, the angles $\theta E$, $\theta X$, and $\theta B$ are represented by the following equations (23) to (25), respectively.

$$\theta_E + \theta_x = 90° + \theta_B \qquad (23)$$

$$\theta_x = 90° + \theta_B - \theta_E \qquad (24)$$

$$\theta_C = 90° - \theta_x = 90° - (90° + \theta_B - \theta_E) = \theta_E - \theta_B \qquad (25)$$

The conditions where light is totally reflected on the inclining portion of the side wall W are represented by the following equation (26) based on the Snell's law.

$$n' \sin \theta_C > 1 \qquad (26)$$

Here, when the equation (25) is applied to the equation (26), the following equation (27) is satisfied.

$$n' \sin(\theta_E - \theta_B) > 1 \qquad (27)$$

Furthermore, the equation (27) is developed to the following equation (28) including the incidence angle $\theta A$ and the angle $\theta E$ between the upper surface of the laminated material 101 and the side wall W using sum-to-product identities of trigonometric functions or the like.

$$\begin{aligned}
&n' \sin\theta_E \cos\theta_B - n' \cos\theta_E \sin\theta_B > 1 \\
&n' \sin\theta_E (1 - 2\sin\theta_B) - n\sin\theta_A \cdot \cos\theta_E > 1 \\
&n' \sin\theta_E - 2n' \sin\theta_B - n\sin\theta_A \cdot \cos\theta_E > 1 \\
&n' \sin\theta_E - 2n' \sin\theta_B \cdot \sin\theta_C - n\sin\theta_A \cdot \cos\theta_E > 1 \\
&n' \sin\theta_E - 2n\sin\theta_A \cdot \sin\theta_B - n\sin\theta_A \cdot \cos\theta_E > 1 \\
&n' \sin\theta_E - \frac{2n}{n'}\sin\theta_A \cdot \sin\theta_A - n\sin\theta_A \cdot \cos\theta_E > 1
\end{aligned} \qquad (28)$$

The equation (28) is conditions of total reflection. Therefore, the following equation (29) obtained by reversing the inequality sign of the equation (28) is conditions where light is not totally reflected.

$$-\frac{2n}{n'}\sin^2\theta_A - n\cos\theta_E \cdot \sin\theta_A + n'\sin\theta_E < 1 \qquad (29)$$

Here, the inclined angle $\theta tilt$ of the side wall can be represented by the angle $\theta E$ between the upper surface of the laminated material 101 and the side wall W, which is represented by the following equation (30).

$$\theta_{tilt} = 90 - \theta_E \qquad (30)$$

Therefore, when the equation (29) and the equation (30) are satisfied, it is possible to cause light not to be totally reflected. Therefore, in FIG. 13, the shaded area represents the area in which the equation (29) and the equation (30) are not satisfied, and the gray area represents the area in which the equation (29) and the equation (30) are satisfied.

Accordingly, when the relationship between the inclined angle of the side wall W of the laminated material 101 and the incidence angle satisfies the equation (29) and the equation (30), it is possible to reduce noise light such as flare and ghost.

As described above, according to the present disclosure, because light beams that have entered the imaging element of the image sensor can be transmitted through the laminated material (optical filter or the like), it is possible to sufficiently exert the desired performance of the laminated material (optical filter). In addition, by making the laminated material in a shape that satisfies the conditions where light is not totally reflected, it is possible to reduce the influence due to noise light such as flare and ghost.

It should be noted that embodiments of the present disclosure are not limited to the above-mentioned embodiments and various modifications can be made without departing from the gist of the present disclosure.

Moreover, the present disclosure may also take the following configurations.

(1) An imaging apparatus that forms an image of a light beam transmitted through an imaging lens on an imaging element, including
a laminated material that is provided on the imaging element, the light beam being transmitted through the laminated material, the laminated material being provided at a position at which an end portion of an upper surface of the laminated material allows an outermost light beam out of light beams to be transmitted therethrough, the light beams entering a pixel in an outer end portion of the imaging element in an effective pixel area, the position having a width Hopt.

(2) The imaging apparatus according to (1), in which
the width Hopt of the laminated material that allows the outermost light beam to be transmitted therethrough is represented based on a thickness of the laminated material, a focal length of a lens, an F-number of the lens, and an image height of an image sensor, by the following formula:

$$Hopt=T*(f-2*H*Fno)/(2*f*Fno+H)$$

in which T, f, Fno, and H represent the thickness of the laminated material, the focal length of the lens, the F-number of the lens, and the image height of the image sensor, respectively.

(3) The imaging apparatus according to (2), in which
based on, in addition to the thickness of the laminated material, the focal length of the lens, the F-number of the lens, and the image height of the image sensor, a refractive index in an area adjacent to an upper side of the laminated material, a refractive index of the laminated material, and a one side angle of incident light beams, the width Hopt is represented by the following formula:

$$Hopt=T*\sqrt{\{(n2-n*n' \sin(\theta Fno))/(n'2-n*n' \sin(\theta Fno))\}}*(f-2*H*Fno)/(2*f*Fno+H)$$

in which n, n', and θFno represent a refractive index in an area adjacent to an upper side of the laminated material, a refractive index of the laminated material, and a one side angle of incident light beams having an F-number of Fno.

(4) The imaging apparatus according to (3), in which the laminated material has a side wall inclined angle θtilt, and the side wall inclined angle θtilt satisfies the following formula:

$$n'*\sin(\theta E)-(2*n)/n'*\sin 2(\theta A)-n*\sin(\theta A)*\sin(\theta E)<1$$

wherein θA and θE represent an incident angle on the laminated material and 90−θtilt, respectively.

(5) The imaging apparatus according to (1), in which
a position of an end portion of a lower surface of the laminated material is located on a side of the effective pixel area nearer than a position of the end portion of the upper surface thereof.

(6) The imaging apparatus according to (2), in which
the upper surface of the laminated material has a width larger than one of a width obtained by adding the effective pixel area, the width Hopt, and a lithography tolerance and a width obtained by adding the effective pixel area, the width Hopt, the lithography tolerance, and bonding accuracy of the laminated material.

(7) The imaging apparatus according to (6), in which
the laminated material is in contact with the imaging element via an adhesive layer having a width larger than one of the width obtained by adding the effective pixel area, the lithography tolerance, and the bonding accuracy of the laminated material and a width of a lower surface of the laminated material, whichever is larger.

(8) The imaging apparatus according to (1), in which
the laminated material is an optical filter.

(9) A camera system including
an imaging apparatus that forms an image of a light beam transmitted through an imaging lens on an imaging element, the imaging apparatus including
a laminated material that is provided on the imaging element, the light beam being transmitted through the laminated material, the laminated material being provided at a position at which an end portion of an upper surface of the laminated material allows an outermost light beam out of light beams to be transmitted therethrough, the light beams entering a pixel in an outer end portion of the imaging element in an effective pixel area, the position having a width Hopt.

(10) The camera system according to (9), in which
the width Hopt of the laminated material that allows the outermost light beam to be transmitted therethrough is represented based on a thickness of the laminated material, a focal length of a lens, an F-number of the lens, and an image height of an image sensor, by the following formula:

$$Hopt=T*(f-2*H*Fno)/(2*f*Fno+H)$$

in which T, f, Fno, and H represent the thickness of the laminated material, the focal length of the lens, the F-number of the lens, and the image height of the image sensor, respectively.

(11) The camera system according to (9), in which
a position of an end portion of a lower surface of the laminated material is located on a side of the effective pixel area nearer than a position of the end portion of the upper surface thereof.

(12) The camera system according to (9), in which the laminated material is an optical filter.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus comprising:
a lens;
an imaging element including a pixel area configured to receive incident light through the lens and convert the incident light into an electric signal; and
an optical element disposed between the lens and the imaging element, the incident light being transmitted through the optical element,
wherein a horizontal distance between an outer edge of the pixel area and an outer edge of an upper surface of the optical element is larger than a distance Hopt,
wherein Hopt is represented by the following formula:

$$\text{Hopt}=T*(f-2*H*Fno)/(2*f*Fno+H), \text{ and}$$

wherein T, f, Fno, and H represent the thickness of the optical element, the focal length of the lens, the F-number of the lens, and the image height of the image sensor, respectively.

2. The imaging apparatus according to claim 1, further comprising a wire bonded to the imaging element.

3. The imaging apparatus according to claim 2, wherein the wire is bonded to a terminal disposed on a peripheral region of the imaging element.

4. The imaging apparatus according to claim 2, wherein the wire is configured to transfer the electrical signal.

5. The imaging apparatus according to claim 2, wherein a horizontal distance between the outer edge of the pixel area and a point where the wire is bonded to the imaging element is larger than Hopt.

6. The imaging apparatus according to claim 1, wherein the optical element is disposed on the imaging element.

7. The imaging apparatus according to claim 1, wherein the optical element has a side wall inclined angle θtilt, and the side wall inclined angle θtilt satisfies the following formula:

$$n'*\sin(\theta E)-(2*n)/n'*\sin 2(\theta A)-n*\sin(\theta A)*\sin(\theta E)<1$$

wherein θA and θE represent an incident angle on the optical element and 90−θtilt, respectively.

8. The imaging apparatus according to claim 1, wherein the horizontal distance between the outer edge of the pixel area and the outer edge of the upper surface of the optical element is larger than a distance obtained by adding Hopt and a lithography tolerance.

9. A camera system comprising:
an imaging apparatus including:
a lens;
an imaging element including a pixel area configured to receive incident light through the lens and convert the incident light into an electric signal; and
an optical element disposed between the lens and the imaging element, the incident light being transmitted through the optical element,
wherein a horizontal distance between an outer edge of the pixel area and an outer edge of an upper surface of the optical element is larger than a distance Hopt,
wherein Hopt is represented by the following formula:

$$\text{Hopt}=T*(f-2*H*Fno)/(2*f*Fno+H), \text{ and}$$

wherein T, f, Fno, and H represent the thickness of the optical element, the focal length of the lens, the F-number of the lens, and the image height of the image sensor, respectively.

10. The camera system according to claim 9, further comprising a wire bonded to the imaging element.

11. The camera system according to claim 10, wherein the wire is bonded to a terminal disposed on a peripheral region of the imaging element.

12. The camera system according to claim 10, wherein the wire is configured to transfer the electrical signal.

13. The camera system according to claim 10, wherein a horizontal distance between the outer edge of the pixel area and a point where the wire is bonded to the imaging element is larger than Hopt.

14. The camera system according to claim 9, wherein the optical element is disposed on the imaging element.

15. The camera system according to claim 9, wherein the optical element has a side wall inclined angle θtilt, and the side wall inclined angle θtilt satisfies the following formula:

$$n'*\sin(\theta E)-(2*n)/n'*\sin 2(\theta A)-n*\sin(\theta A)*\sin(\theta E)<1$$

wherein θA and θE represent an incident angle on the optical element and 90−θtilt, respectively.

16. The camera system according to claim 9, wherein the horizontal distance between the outer edge of the pixel area and the outer edge of the upper surface of the optical element is larger than a distance obtained by adding Hopt and a lithography tolerance.

* * * * *